United States Patent [19]

Fujita et al.

[11] Patent Number: 5,294,818
[45] Date of Patent: Mar. 15, 1994

[54] MISFET INCLUDING GAAS SUBSTRATE AND A GROUP II-VI GATE INSULATOR

[75] Inventors: Shigeo Fujita, Kyoto; Shizuo Fujita, Osaka; Susumu Fukuda, Kyoto, all of Japan

[73] Assignee: Murata Manufacturing Co. Ltd., Japan

[21] Appl. No.: 910,657

[22] Filed: Jul. 8, 1992

[30] Foreign Application Priority Data

Jul. 8, 1991 [JP] Japan ................................ 3-194927

[51] Int. Cl.$^5$ .................. H01L 29/161; H01L 29/205; H01L 29/80; H01L 29/20
[52] U.S. Cl. ...................................... 257/289; 257/192; 257/194; 257/200; 257/201; 257/256; 257/262
[58] Field of Search ............... 257/256, 262, 279, 289, 257/613, 614, 192, 194, 200, 201

[56] References Cited

U.S. PATENT DOCUMENTS 4,160,261 7/1979 Casey, Jr. et al. ..................... 357/42
4,317,127 2/1982 Nishizawa .............................. 357/23

Primary Examiner—Jerome Jackson
Assistant Examiner—Valencia M. Wallace
Attorney, Agent, or Firm—Ostrolenk, Faber, Gerb & Soffen

[57] ABSTRACT

A MISFET includes a GaAs substrate, a gate insulating film of a II-VI group compound including Zn, Mg, S, and Se epitaxially grown on the GaAs substrate, and a gate electrode formed on the gate insulating film.

4 Claims, 4 Drawing Sheets

MISFET INCLUDING GAAS SUBSTRATE AND A GROUP II-VI GATE INSULATOR

BACKGROUND OF THE INVENTION

1. Field of the Invention

The present invention relates to a MIS (Metal Insulator Semiconductor) FET (Field Effect Transistor), and more particularly, to an improvement of a MISFET including a GaAs substrate.

2. Description of the Background Art

Logical elements utilizing a GaAs-MES (Metal Semiconductor) FET or a GaAs-J (Junction) FET had a problem that the logic voltage swing could not be increased, because an increase in logic voltage swing will cause forward current to flow via a gate junction. If a GaAs-MISFET is used, the aforementioned problem will not occur, logically, because the gate electrode is insulated by a gate insulating film, allowing the formation of a high speed logical element that can permit to a great logic voltage swing. The usage of a GaAs-MISFET also allows the formation of a high frequency analog element that can have a signal with a large voltage swing applied to the gate electrode.

FET is known

In the conventional art, a GaAs-MISFET is known including a gate insulating film made of a material such as $SiO_2$, $SiN_x$, or $CaF_2$ formed on a GaAs substrate by thermal CVD (Chemical Vapor Deposition), plasma-enhanced CVD, photo CVD, or sputtering, and a gate electrode formed thereabove. However, the use of $SiO_2$, $SiN_x$, or $CaF_2$ as a gate insulating film cause an undesired increase in interface state density on account of the interface structure between the gate insulating film and the GaAs substrate being disturbed. It was therefore difficult to manufacture a practical GaAs-MISFET.

A pseudo-MISFET is known in the conventional art using an undoped A(GaAs film formed on a GaAs substrate by the MBE (Molecular Beam Epitaxy) deposition method or by the MO (Metal Organic) CVD method substituting a gate insulating film. Although this pseudo-MISFET has a good gate interface with a low interface state density, the AlGaAs film does not establish complete lattice matching with the GaAs substrate. Another disadvantage is that the band offset between the valance band of the gate insulating film and the valence band of the GaAs substrate (i.e., an energy barrier) can not be increased because of the insufficient energy band gap in the AlGaAs film. It was therefore difficult to realize a p channel MISFET.

A MISFET is known in the conventional art using a II-VI group compound semiconductor such as ZnS, ZnSe, or ZnSSe as a gate insulating film. Although ZnS and ZnSe both do not establish lattice matching with a GaAs substrate, the lattice constant of ZnSe is close to that of GaAs to allow a good gate interface by reducing significantly the thickness of the ZnSe film. Furthermore, if the ternary compound ZnSSe is used as a gate insulating film, lattice matching can be obtained between the gate insulating film and the GaAs substrate in the composition of $ZnS_{0.06}Se_{0.94}$ to result in a good gate interface. These II-VI group compound semiconductors have a relatively great energy band gap.

However, the band offset amount at the conduction band side between the gate insulating film formed of the aforementioned II-VI group compound semiconductor and the GaAs substrate can not be increased, so that the aforementioned II-VI group compound semiconductors are not practical as a gate insulating film in a GaAs-MISFET.

The GaAs-MISFET of the conventional art had the problems of undesired high interface energy level between the interface of a gate insulating film and a GaAs substrate and insufficient band offset. A practical GaAs-MISFET was not yet obtained.

SUMMARY OF THE INVENTION

In view of the foregoing, an object of the present invention is to provide a practical MISFET having a low interface energy level density and a great band offset between a gate insulating film and a GaAs substrate.

A MISFET according to the present invention includes a GaAs substrate, a gate insulating film of a II-VI group compound semiconductor including Zn, Mg, S, and Se on the GaAs substrate, and a gate electrode formed on the gate insulating film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
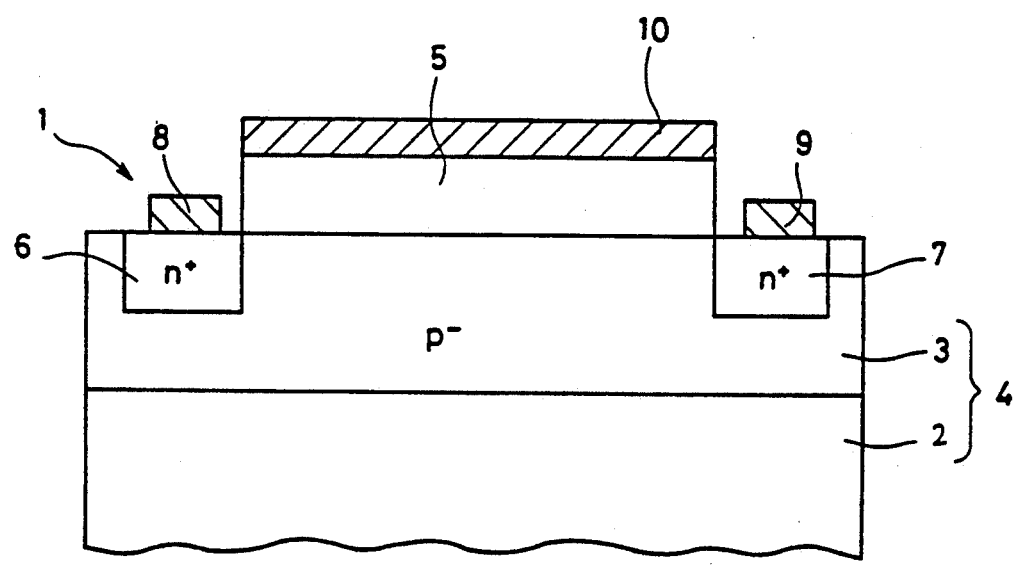
FIG. 1 is a schematic sectional view of a MISFET according to an embodiment of the present invention.

Referring to FIG. 1, a GaAs-MISFET according to an embodiment of the present invention will be described hereinafter. In this MISFET 1, a $p^-$-GaAs layer 3 is formed on a semi-insulating GaAs substrate 2 by epitaxial growth or ion implantation. The semi-insulating GaAs substrate 2 and the $p^-$-GaAs layer 3 are referred to as a GaAs substrate 4 hereinafter. Above the GaAs substrate 4, a gate insulating film 5 of a II-VI group compound semiconductor $Zn_{1-x}Mg_xS_ySe_{1-y}$ is formed by the MOCVD method or the MBE method. An $n^+$ source region 6 and an n drain region 7 are formed at the sides of the gate insulating film 5 by means of ion implantation or thermal diffusion of n−type dopants into the $p^-$-GaAs layer 3. A source electrode 8 and a drain electrode 9 are formed on the source region 6 and the drain region 7, respectively. A gate electrode 10 is formed on the gate insulating film 5. The GaAs-MISFET of FIG. 1 is an inversion type MISFET that operates by inducing carriers in the interface of the GaAs substrate 4 and the gate insulating film 5.

The II-VI group compound semiconductor $Zn_{1-x}Mg_xS_ySe_{1-y}$ composition available as a gate insulating film of the n channel type MISFET of FIG. 1 must be set to satisfy the following three conditions.

Condition 1: The gate insulating film must have a required amount of band offset ΔEc (the height of the energy barrier between the conduction band of the gate insulating film and the conduction band of the GaAs substrate) with respect to the conduction band of the GaAs substrate (refer to FIG. 2), in order to prevent the carriers (electrons) on the surface of the GaAs substrate from passing over the gate insulating film by thermal energy.

Condition 2: Carriers must not pass through the gate insulating film as a result of a tunneling effect under the requirements of generating a strong inversion at the surface of the GaAs substrate.

Condition 3: Carriers must not pass through the gate insulating film as a result of a tunneling effect even when a voltage of 5 volts according to the usual TTL (Transistor Transistor Logic) level is applied to the gate electrode as the maximum value of the MISFET gate driving voltage (refer to FIG. 3).

Because the MISFET is designed to have the surface of the GaAs substrate heavily inverted when a voltage of 5 volts is applied to the gate electrode, condition 2 will inevitably be satisfied if condition 3 is met. Thus the composition of $Zn_{1-x}Mg_xS_ySe_{1-y}$ should be established to satisfy conditions 1 and 3.

The amount of band offset is now considered. Although the band offset amount ΔEc between the conduction bands of the gate insulating film and the GaAs substrate depends upon the composition of the gate insulating film, the band offset amount ΔEc must be greater than the minimum value of $\Delta Ec_{min}$ which is determined by the above described three conditions. The more the band offset amount ΔEc is greater than the minimum value $\Delta Ec_{min}$, the more preferable ΔEc is. In order to increase the band offset amount ΔEc, the ratio of Mg in $Zn_{1-x}Mg_xSE_{1-y}$ should be increased. If the ratio of Mg is excessively increased, the gate insulating film will easily have a rock salt type crystal structure, making it difficult to grow a gate insulating film of good quality on the GaAs substrate. Therefore, the maximum value $\Delta Ec_{max}$ of the band offset amount ΔEc must be set to an appropriate value.

The minimum value $\Delta Ec_{min}$ and the maximum value $\Delta Ec_{max}$ of the band offset amount ΔEc are determined taking into consideration conditions 1 and 3 and the nature of the gate insulating film. Although the p⁻-GaAs layer in the GaAs substrate is assumed to have a hole density of $10^{16}/cm^3$ in room temperature in the following, the hole density is not limited to this value.

Figure 2:
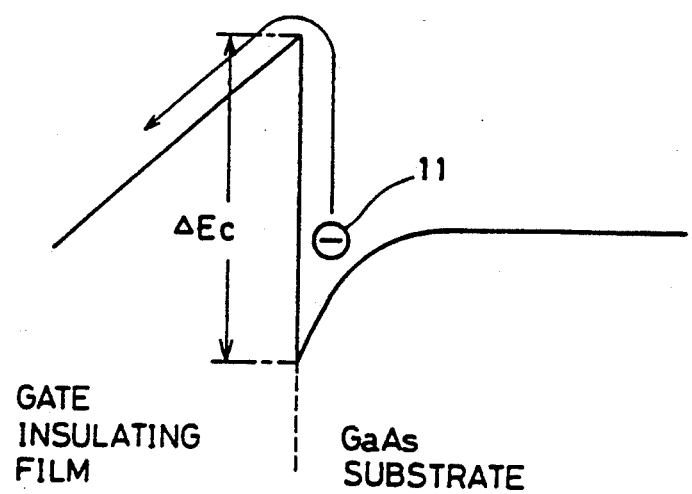
FIG. 2 is a diagram illustrating the electronic energy state in the vicinity of the interface region of a GaAs substrate and a gate insulating film.

First, condition 1 is considered. Referring to FIG. 2 where carriers (electrons) 11 travel beyond the barrier of the band offset ΔEc by virtue of the thermal energy at a temperature of T (=300° K), the following equation (1) must be satisfied to suppress the number of carriers going beyond the barrier to be not more than 1% of the accumulated carriers.

$$\exp(-\Delta Ec/kT) < 0.01 \tag{1}$$

where k represents Boltzmann's constant. More specifically, ΔEc is expressed by the following equation (2).

$$\Delta Ec > 4.6kT = 0.12eV \tag{2}$$

Figure 3:
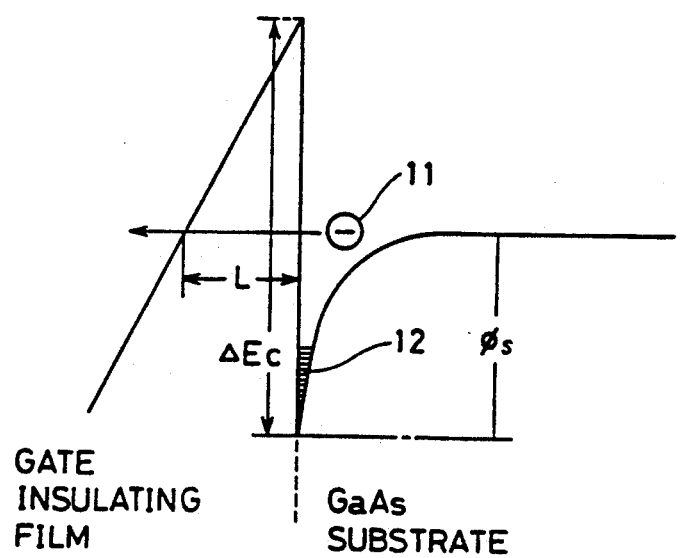
FIG. 3 is a diagram illustrating another electronic energy state in the vicinity of the interface between a GaAs substrate and a gate insulating film.

Next, condition 3 is considered. FIG. 3 shows the energy state when voltage V is applied to the gate electrode to generate a strongly inverted layer 12 at the surface of the GaAs substrate. In FIG. 3, $\phi s$ represents the surface potential required to invert strongly the surface of the GaAs substrate, and L represents the tunneling distance the carriers 11 pass through. Here, the electric field Ei in the gate insulating film is represented by the following equation (3).

$$Ei = (V - \phi s)/di \tag{3}$$

where di represents the thickness of the gate insulating film. Although the surface potential $\phi s$ required to invert strongly the surface of the GaAs substrate is calculated as $\phi s = 1.16eV$ at the initiation of the inversion, $\phi s$ becomes slightly greater than 1.16eV at the strongly inverted state where voltage V is applied. Hence, by assuming that the surface potential $\phi s$ when voltage V=5 volts is applied is 1.3eV including some allowance, the electric field Ei in the gate insulating film is expressed as the following equation (4).

$$Ei = (5 - 1.3)/di = 3.7/di \tag{4}$$

When the hole density is $10^{16}/cm^3$ in the GaAs substrate, the electric field Es at the surface of the GaAs substrate at the initiation of the strong inversion is expressed by the following equation (5).

$$Es = 5.7 \times 10^4 V/cm \tag{5}$$

According to Gauss's law, the electric field Ei of the gate insulating film at the state of heavy inversion is expressed as the following equation (6).

$$Ei \gtrsim \epsilon s \cdot Es / \epsilon i = 1.3 \times 10^5 V/cm \tag{6}$$

where $\epsilon s$ and $\epsilon i$ represent the dielectric constants of the GaAs substrate and the gate insulating film, respectively. In equation (6), the dielectric constant of ZnSe is used as $\epsilon i$.

Therefore, the following equation (7) is obtained by equations (4) and (6).

$$di \lesssim 2900\text{Å} \tag{7}$$

The thickness di of the gate insulating film must be not more than 2900Å in order to reliably generate a strong inversion layer by a 5 volts gate voltage application.

The allowable minimum $\Delta Ec_{min}$ of the band offset amount ΔEc of the conduction band is determined as the minimum value that can maintain a tunneling probability within a negligible range in the film thickness di. The tunneling distance L is expressed as $L = \Delta Ec / Ei$, whereby the following equation (8) is obtained using equation (4).

$$L = \Delta Ec \cdot di / 3.7 \tag{8}$$

The tunneling probability can substantially be neglected if L=100Å, whereby the following equation (9) can be obtained from equation (8).

$$\Delta Ec \gtrsim 3.7 \times L / di = 0.13eV \tag{9}$$

Because equation (2) is obtained from condition 1, the minimum value $\Delta Ec_{min}$ of ΔEc satisfying both the equations of (2) and (9) is expressed by the following equation (10).

$$\Delta Ec_{min} = 0.13 eV \tag{10}$$

Regarding the maximum value $\Delta Ec_{max}$ of the band offset amount $\Delta Ec$, only condition 3 needs to be considered because condition 3 is more critical than condition 1. With $L=100\text{Å}$ as the tunneling distance and $di=400\text{Å}$ as the thickness of the gate insulating film, the following equation (11) can be obtained from equation (8).

$$\Delta Ec_{max} = 3.7 \times 100 / 400 = 0.93 eV \tag{11}$$

As mentioned above, it is preferred that the band offset amount $\Delta Ec$ is as great as possible. However, if the ratio of Mg in the gate insulating film is increased in order to bring the band offset amount $\Delta Ec$ greater than the maximum value $\Delta Ec_{max}$, the gate insulating film is more likely to have a rock salt type crystal structure. It will therefore be difficult to grow the crystal of the gate insulating film on the GaAs substrate.

Thus, the following equation (12) must be satisfied for a MISFET to operate in practice.

$$0.13 eV \lesssim \Delta Ec \lesssim 0.93 eV \tag{12}$$

Therefore, the composition ratio of X and Y in $Zn_{1-x}Mg_xS_ySe_{1-y}$ is determined to obtain a band offset amount $\Delta Ec$ within the range of equation (12).

Figure 4:
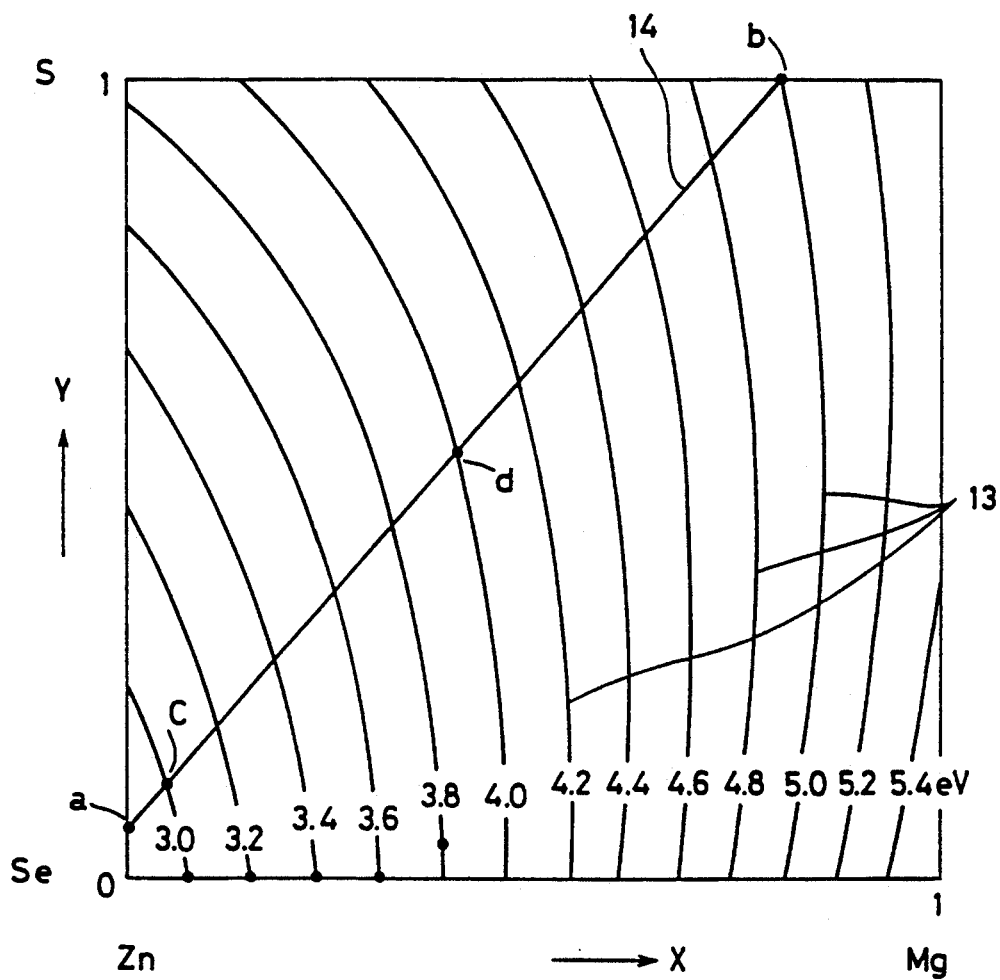
FIG. 4 is a graph showing the relationship of the II-VI group compound semiconductor $Zn_{1-x}Mg_xS_ySe_{1-y}$ composition and energy band gap Eg (eV).

FIG. 4 shows the relation ship between the composition of II-VI group compound semiconductor $Zn_{1-x}Mg_xS_ySe_{1-y}$ and the band gap Eg. The abscissa represents the composition ratio of x and the ordinate represents the composition ratio of y. Curves 13 represent the contour line of the band gap Eg, and the value on each contour line represents the corresponding band gap Eg in the unit of eV. The slanted straight line 14 in FIG. 4 represents the composition of $Zn_{1-x}Mg_xS_ySe_{1-y}$ having a lattice constant identical to that of GaAs, which will be referred to as an "equivalent lattice constant line" hereinafter. This equivalent lattice constant line 14 corresponds substantially to the direction from ZnSe ($x=1$, $y=0$) towards MgS ($x=0$, $y=1$). More specifically, the equivalent lattice constant line 14 runs from point (a) of $Zn_{0.06}Se_{0.94}$ (Eg=2.8eV) to point (b) of $Zn_{0.2}Mg_{0.8}S$ (Eg=5.0eV), in which the band gap Eg increases as coming nearer towards point (b) from (a).

Figure 5:
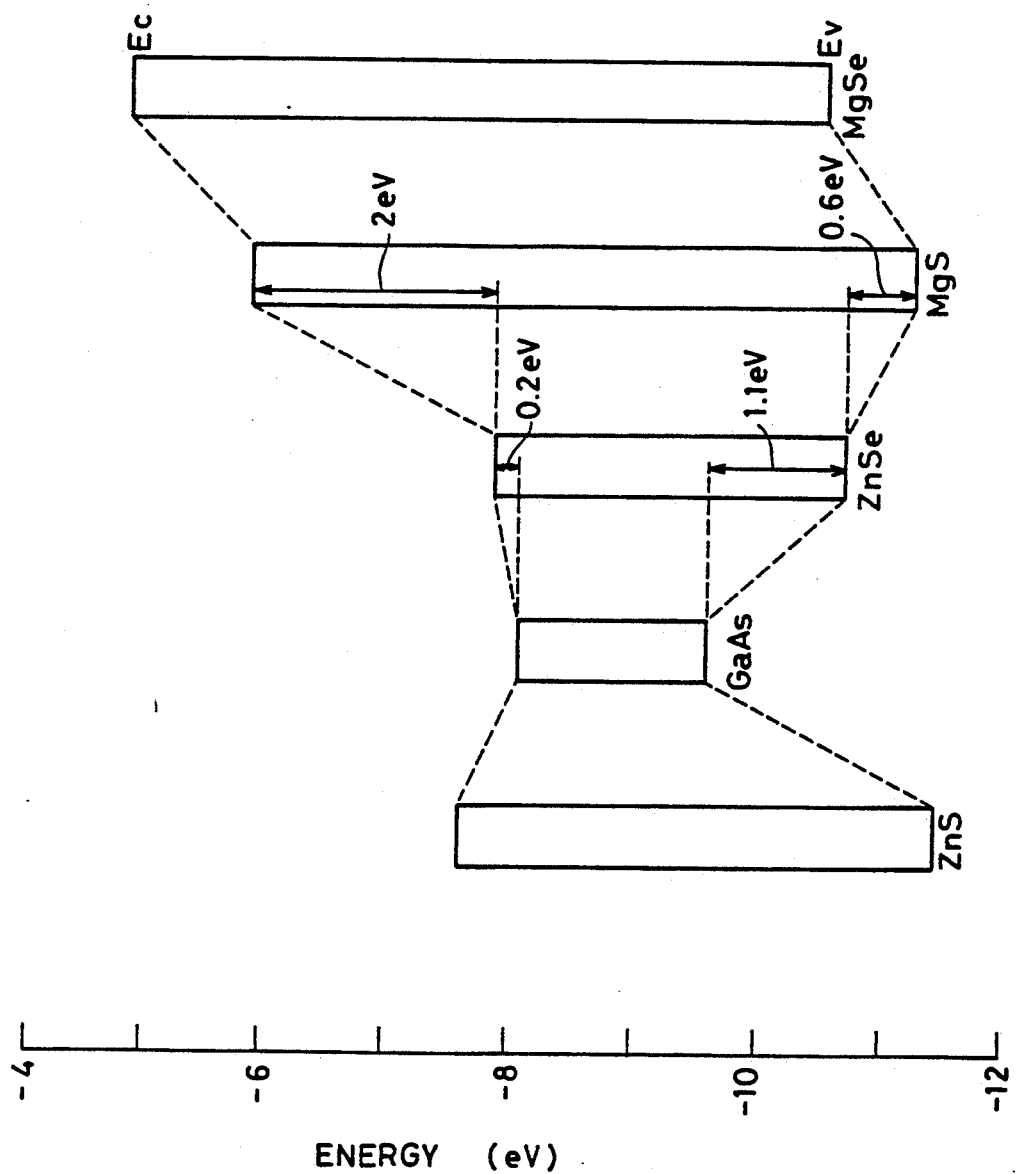
FIG. 5 is a graph showing the energy band gaps of GaAs, ZnS, ZnSe, MgS, and MgSe calculated by the approximation of Harrison's LCAO (Linear Combination of Atomic Orbitals).

FIG. 5 shows the energy band gaps in GaAs, ZnS, ZnSe, MgS, and MgSe calculated by Harrison's LCAO approximation. It can be appreciated from FIG. 5 that the difference $\Delta Ec$ between the minimum levels of the conduction bands and the difference $\Delta eV$ between the maximum levels of the valence band of ZnSe and MgS are respectively $\Delta Ec=2eV$ and $\Delta Ev=0.6eV$. It can be considered that the increase of the band gap Eg from point (a) towards point (b) in FIG. 4 is distributed into $\Delta Ec$ and $\Delta Ev$ at the ratio of approximately 2 : 0.6. For example, if Eg increases by 1eV, the minimum level Ec of the conduction band increases by $1 \times 2 / (2+0.6) = 0.77 eV$.

Although a value of 0.2eV is calculated as the band offset $\Delta Ec$ between ZnSe and GaAs according to FIG. 5, a value not more than 0.1eV is obtained experimentally. Therefore, $\Delta Ec$ between ZnS and GaAs can be approximated to 0eV. $\Delta Ec$ between Zns and GaAs also does not take a great value. Therefore, a great error will not be introduced even if $\Delta Ec$ is approximated as $\Delta Ec=0$ between $ZnS_{0.06}Se_{0.94}$ and GaAs.

According to the above-described results, the condition of equation (12) is equivalent to Ec in a desired gate insulating film being greater by 0.13eV to 0.93eV than that of $ZnS_{0.06}Se_{0.94}$ at point (a). Considering that the distribution of $\Delta Ec$ and $\Delta Ev$ is 2 : 0.6 as described above, the composition range of a desired gate insulating film has a band gap Eg in the gate insulating film greater than that of $ZnS_{0.06}Se_{0.94}$ at point (a) by 0.17eV to 1.2eV. In other words, the composition range of a desired gate insulating film is set to satisfy equation (13).

$$3eV \lesssim Eg \lesssim 4eV \tag{13}$$

The composition range that meets equation (13) corresponds to the range of point (c) to point (d) on the equivalent lattice constant line 14 of FIG. 4. The composition of point (c) is $Zn_{0.95}Mg_{0.05}S_{0.11}Se_{0.89}$, and the composition of point (d) is $Zn_{0.59}Mg_{0.41}S_{0.52}Se_{0.89}$. If the thickness of the gate insulating film is approximately 400Å, the crystal of the gate insulating film can be grown coherently on the GaAs substrate even if the lattice constant of approximately 0.6% between the GaAs substrate and the gate insulating film does not match. Therefore, a small area converting the vicinity of the line from point (c) to point (d) on FIG. 4 is allowable for the composition. Therefore, a MISFET that can operate in practice is obtained using the composition ratio meeting the conditions of equations (14) and (15).

$$0.01 \lesssim x \lesssim 0.4 \tag{14}$$

$$0 \leq y \leq 0.6 \tag{15}$$

It can be easily inferred from FIG. 5 that the maximum level of the valence band of $Zn_{1-x}Mg_xS_ySe_{1-y}$ has a great band offset amount $\Delta Ev$ with respect to the maximum level of the valence band of GaAs regardless of the composition. Therefore, the composition of $Zn_{1-x}Mg_xS_ySe_{1-y}$ satisfying equation (12) can be used for the gate insulating film of a p channel MISFET as well as of an n channel MISFET.

By setting the composition of the gate insulating film on or in the vicinity of the equivalent lattice constant line 14 of FIG. 4, the lattice matching of the gate insulating film with respect to the GaAs substrate can be made favorable. It can be inferred from FIG. 5 that the gate insulating film having any composition of the AnMgSSe system has a band gap greater than that of GaAs. A II-VI group compound semiconductor $Zn_{1-x}Mg_xS_ySe_{1-y}$ has a small interface state density at the interface with the GaAs substrate, so that a good gate insulating film can be obtained.

Thus, according to the present invention, (1) the interface state density between a gate insulating film and a GaAs substrate can be reduced; (2) a good lattice matching can be obtained between a gate insulating film and a GaAs substrate; (3) the band gap of a gate insulating film can be increased to obtain a good gate insulating film; (4) the band offset amount between a GaAs substrate and a gate insulating film can be increased with respect to both the valence band and the conduction band. As a result, a practical GaAs-MISFET can be obtained.

By using the GaAs-MISFET of the present invention, a high speed logical element can be obtained that can be applied to a great logic voltage swing. Furthermore, a high frequency analog element can be formed that allows application of a signal of a large voltage swing to a gate electrode.

Because a p channel type MISFET can be provided as well as an n channel type MISFET according to the present invention, a complementary type integrated circuit can be formed on a GaAs substrate corresponding to a CMOS (Complementary metal Oxide Semiconductor) integrated circuit on a silicon substrate. As a result, a GaAs integrated circuit that can operate at a high speed with low power consumption can be provided that was not obtained by the conventional art.

Although the present invention has been described and illustrated in detail, it is clearly understood that the same is by way of illustration and example only and is not to be taken by way of limitation, the spirit and scope of the present invention being limited only by the terms of the appended claims.

We claim:
1. A MISFET comprising:
GaAs substrate,
a gate insulating film of a II-VI group compound including Zn, Mg, S, and Se, epitaxially grown on said substrate, and
a gate electrode formed on said gate insulating film.
2. The MISFET according to claim 1, wherein said gate insulating film is formed of a II-VI group compound of $Zn_{1-x}Mg_xS_ySe_{1-y}$, with a composition within the range of $0.01 \lesssim x \lesssim 0.4$ and $0 \leq y \lesssim 0.6$.
3. The MISFET according to claim 1, wherein said gate insulating film has a lattice matching said GaAs substrate.
4. The MISFET according to claim s, wherein said gate insulating film has a lattice matching said GaAs substrate.